United States Patent [19]

De Rozarieux et al.

[11] Patent Number: 5,040,162

[45] Date of Patent: Aug. 13, 1991

[54] COVER DEVICE FOR CONTROLS

[75] Inventors: David De Rozarieux, Middlesex; Brian E. Bayley, Herts, both of England

[73] Assignee: The Kiddi Group Plc, London, England

[21] Appl. No.: 376,055

[22] Filed: Jul. 6, 1989

[30] Foreign Application Priority Data

Jul. 6, 1988 [GB] United Kingdom ............. 8816077.5

[51] Int. Cl.⁵ .............................................. G11B 33/02
[52] U.S. Cl. ..................................... 369/75.1; 369/79; 369/292; 292/1; 292/87; 206/1.5; 220/323; 220/334; 220/346; 436/135
[58] Field of Search ................... 369/75.1, 79; 292/87, 292/80, 1; 206/1.5; 220/323, 334, 346, 347; 439/135, 136, 142

[56] References Cited

U.S. PATENT DOCUMENTS

| 318,781 | 5/1885 | Miller | 292/80 |
|---|---|---|---|
| 2,685,983 | 8/1954 | Kelley . | |
| 3,268,229 | 8/1966 | Funk | 369/75.1 |
| 3,888,494 | 6/1975 | Herst | 369/75.1 X |
| 3,949,899 | 4/1976 | Jacobs et al. | 206/1.5 X |
| 3,971,240 | 7/1976 | Love, Sr. | 70/160 |
| 4,335,828 | 6/1982 | Robinson et al. . | |
| 4,515,419 | 5/1985 | Hampel et al. . | |
| 4,524,438 | 6/1985 | Einhaus | 369/292 X |
| 4,688,023 | 8/1987 | McGill et al. | 206/1.5 X |

FOREIGN PATENT DOCUMENTS

| 737699 | 8/1969 | Belgium . |
|---|---|---|
| 901134 | 11/1984 | Belgium . |
| 0230375 | 1/1987 | European Pat. Off. . |
| 1005566 | 10/1955 | Fed. Rep. of Germany . |
| 6950154 | 12/1969 | Fed. Rep. of Germany . |
| 2836339 | 3/1980 | Fed. Rep. of Germany . |
| 3438338 | 4/1986 | Fed. Rep. of Germany . |
| 8631487 | 11/1986 | Fed. Rep. of Germany . |
| 2308277 | 11/1976 | France . |
| 82/03512 | 3/1982 | PCT Int'l Appl. . |
| 85/02516 | 11/1983 | PCT Int'l Appl. . |
| 2104953 | 7/1982 | United Kingdom . |
| 2195955 | 10/1986 | United Kingdom . |

OTHER PUBLICATIONS

Abstract: German document DE 7806474, "Klappe mit Sichtscheibe fur ein Gehause", ANM: Siemens AG, 1000 Berlin und 8000 Munchen, Klasse HO5, p. 1431.
Abstract: German document DE 7913611, "Gehause mit einer Blende" ANM: TE KA DE Felten & Guilleaume Fernmeldeanlagen GmbH, 8500 Nurnberg, Kasse HO5, 5/11/79, p. 1545.

Primary Examiner—William M. Shoop, Jr.
Assistant Examiner—Randy W. Gibson
Attorney, Agent, or Firm—Lowe, Price, LeBlanc and Becker

[57] ABSTRACT

A control cover device is supplied in kit form and to be assembled and fitted by the user to a piece of equipment having a front control panel and opposite side walls projecting rearwardly from opposite ends of the control panel. The device comprises a cover which is pivotally, or otherwise moveably secured to the apparatus by means of mounting members which are attachable to the opposite side walls of the equipment casing, and to which the opposite ends of the cover are suitably attached.

The mounting members are each provided with a catch for releasably retaining the cover in a control-covering position. The cover includes an elongate screen piece which can be cut to a length suitable for the particular equipment, and the mounting members are of plate-like form.

10 Claims, 2 Drawing Sheets

COVER DEVICE FOR CONTROLS

This invention relates to a cover device for covering the controls of equipment, for example electronic equipment such as video tape players, amplifiers, tuners, CD players etc.

It is often desirable, particularly with video tape players which are commonly sited at a low level, to employ some means to inhibit access to the controls of the equipment by small children. A cover device is known in which an elongate cover member is provided with releasably operable attachment fingers at its opposite ends to enable it to be releasably attached to fixing blocks attached to the side faces of a video tape recorder adjacent opposite ends of its front panel. This known arrangement has several disadvantages.

Firstly, as the fixing blocks are adapted for releasably receiving the attachment fingers of the cover, they are necessarily of a thickness which adds considerably to the overall width of the equipment. Secondly, the device is somewhat awkward to operate as the cover needs to be completely removed from the equipment to provide access to the controls, resulting in the inconvenience of having to find somewhere to put the cover when it is not in place. Thirdly, the cover member is integrally formed with the attachment fingers at its opposite ends i.e. at a fixed distance apart, and is therefore usable only for equipment of a particular length of front panel; different length covers must be provided for different sized equipment.

The present invention seeks in its various aspects to alleviate at least partly these disadvantages.

According to a first aspect of the invention, there is provided a cover device for covering the controls on a control panel of equipment, such as a video recorder, the device comprising an elongate cover and mounting means for displaceably attaching said cover to the apparatus so that it extends across said front panel and is displaceable away from a control-covering position while so attached to reveal said controls to permit operation thereof, wherein said mounting means comprises first and second separate mounting members which are fixedly securable to said equipment at positions at or adjacent said opposite ends of said control panel, said cover member being movably securable at its opposite ends to the respective mounting members, and said mounting means comprising manually releasable latch means for releasably latching said cover member in its said control-covering position.

In a first embodiment, the cover is hinged to the mounting members and is pivotable to and from the control-covering position in which it lies over the front of said panel of the equipment.

In a second embodiment, the opposite ends of the cover member are slidably received by the respective mounting members so that the cover member can slide to and from its control-covering position.

Preferably, each mounting member is provided with a manually releasable catch for engaging the respective end of the cover member, whereby the cover member is releasably held in its control-covering position. Releasing of the cover member in such an arrangement requires simultaneous manual release of both catches and so involves exercising a degree of dexterity not normally possessed by young children, yet well within a normal adult's abilities.

The cover member preferably comprises an elongate screen which is of uniform cross section and can be cut by the user to a length suitable for the particular equipment on which the device is to be used, and a pair of end pieces which are securable to the ends of the screen e.g. by an interference fit, and which are suitably adapted to be moveably secured to the mounting members. With this arrangement, the cover device can be supplied as a kit which can be adapted by the user to fit any of a large number of different machines with front control panels of different widths.

The mounting members are preferably in the form of plate members which are adapted to be attached face-on to respective side walls of the equipment extending rearwardly from opposite ends of said control panel. With this construction, the cover device adds little to the overall width of the apparatus; this is particularly advantageous where the apparatus is held within a relatively close-fitting cabinet leaving only a narrow space between the side walls of the cabinet and the side walls of the casing of the apparatus.

According to another aspect of the invention, there is provided an assembly for the construction of a cover device for covering the controls on a control panel of equipment, such as a video recorder, the assembly comprising elements for the construction of an elongate cover, and first and second mounting members which are fixedly securable to said equipment at positions at or adjacent opposite ends of said control panel, and which are adapted for displaceably mounting said cover to the apparatus so that it extends across said front panel, said elements comprising an elongate screen of uniform cross-section, and a pair of end pieces attachable to the opposite ends of the screen and adapted to be releasably located by said mounting members in a control-covering position.

According to yet another aspect of the invention, there is provided a cover device for covering the controls on the front panel of equipment, such as a video recorder, the equipment having opposite upright side walls extending rearwardly from opposite ends of the front panel, the device comprising an elongate cover, and mounting means for displaceably attaching said cover to the apparatus so that it extends across said front panel and is displaceable away from a control-covering position to reveal said controls to permit operation thereof, said mounting means comprising first and second mounting members which are fixedly securable to said opposite side walls of said apparatus at positions adjacent said opposite ends of said front panel, said cover member being moveably securable at said opposite ends to the respective mounting members, each mounting member comprising a substantially flat element attachable face-on to a respective said side wall of the apparatus.

Preferred embodiments of the invention will now be described by way of example with reference to the accompanying drawings, in which.

Figure 1:
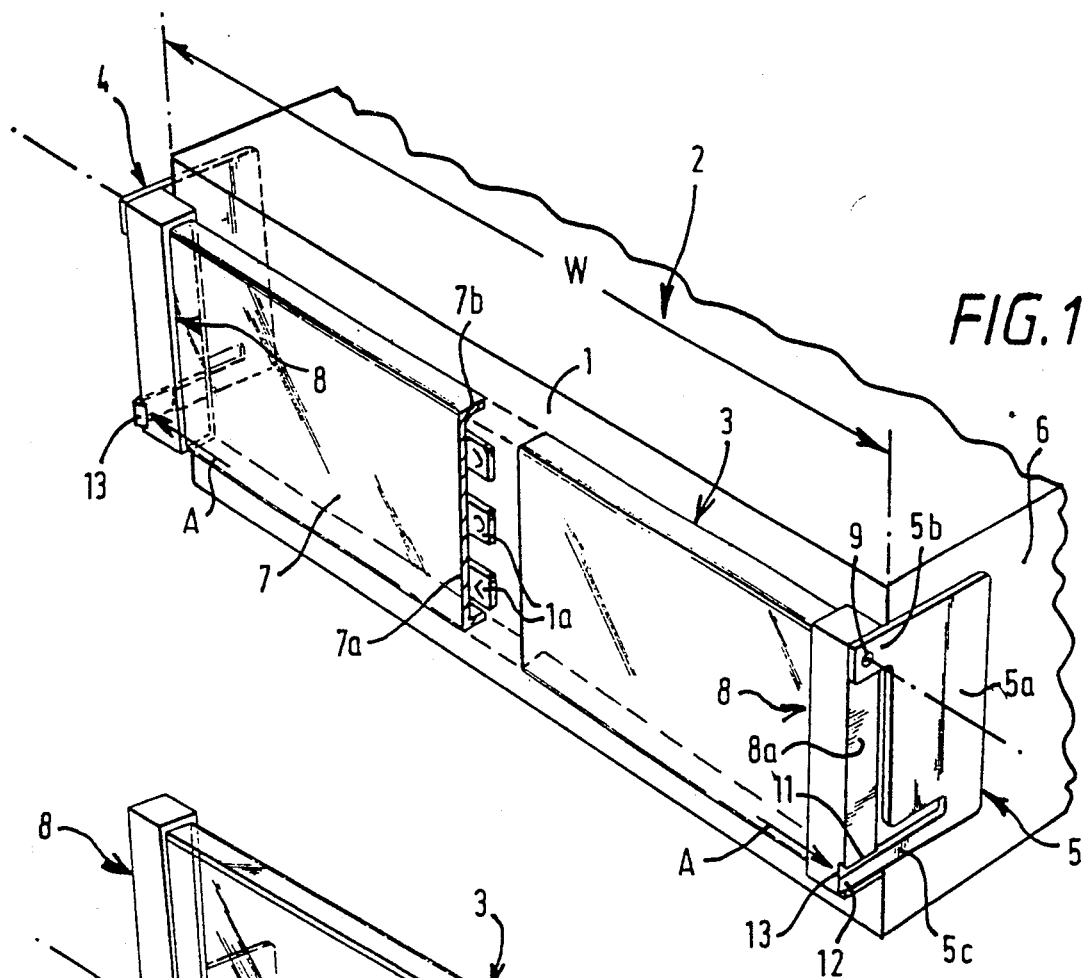
FIG. 1 is a front perspective view of a cover device according to a first embodiment of the invention, shown assembled on a casing of equipment, such as a video recorder.
Figure 2:
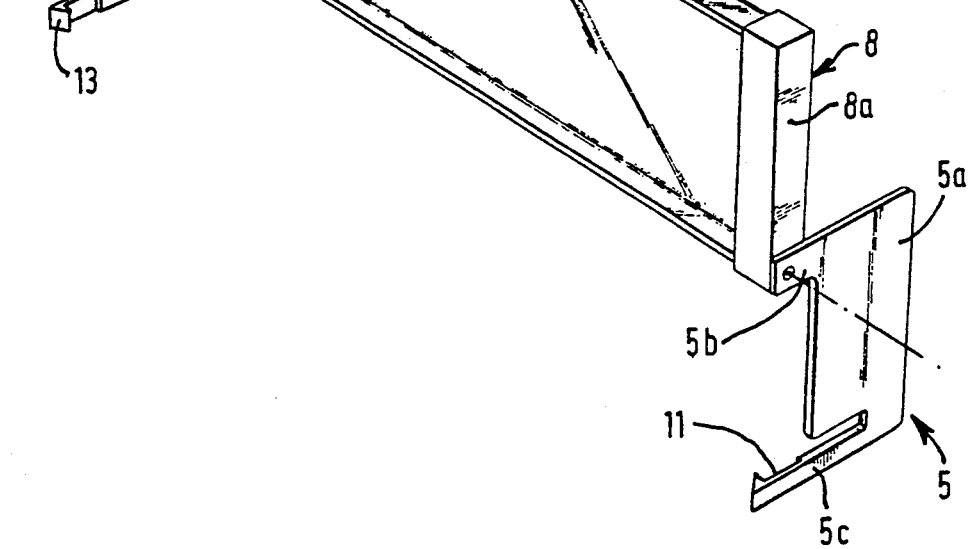
FIG. 2 is a front perspective view of the cover device of FIG. 1, shown, for the sake of clarity, without the casing of the equipment, but in the raised position.

With reference to FIGS. 1 and 2, a cover device assembled from a kit of parts by the user on the front face 1 of equipment 2, such as a video recorder, comprises an elongate cover 3 and first and second mounting members 4 & 5, each of substantially flat, plate-like construction, and each attached to respective ones of opposite side walls 6 of the casing of the video 2, at positions adjacent opposite ends of the front face 1.

The elongate cover 3 is assembled from an elongate screen member 7 of uniform cross-section and a pair of end pieces 8. The screen member 7 is preferably moulded or extruded from plastics materials and in its illustrated form has a broad front wall 7a and narrow edge walls 7b projecting rearwardly from the upper and lower edges of the front wall 7a. The end pieces 8 are in the form of hollow caps which push on to the ends of the screen member 7 and are held there by an interference fit between the inner surfaces of the caps and the outer surfaces of the ends of the screen member.

Each end cap 8 is formed on its end face 8a with a hole (not shown) for receiving the end of a respective pivot screw 9 fixed to the respective mounting member 4, 5. The cover is thereby pivotally secured to the mounting member 4, 5 in such a way that it extends across the front face 1 and is pivotable upwardly from its vertical position, illustrated in the figure, in which it covers control elements 1a on the front face.

Each mounting member 4, 5 has a main flat body portion 5a which is attached to the side face 6 of the video casing by, for example, double-sided adhesive tape or pads, so that it lies flat against that side wall, and a forwardly projecting pivot arm 5b which projects forwardly beyond the plane of the front face 1. The pivot screw 9 is received in a screw threaded hole in the pivot arm 5b. The mounting member also includes a lower, forwardly projecting locking finger 5c, which also projects forwardly beyond the plane of the front face 1.

The resilient locking fingers 5c each constitute a catch for releasably latching the cover at its opposite ends in the control-covering position shown. For this purpose, each locking finger is formed at its forward end with a broad groove 11 and an end pawl 12 which together engage the lower outer portion of the respective end piece 8 in the control-covering position. Each pawl 12 includes an inwardly inclined cam surface 13.

As mentioned earlier, the cover device may be supplied as a kit of parts to be adapted and fitted by the purchaser to the equipment. In the kit, the screen member 7 will be supplied over-sized, that is to say at least as long as the external width of the widest model of machine for which the device is intended, e.g. video recorders. The kit will include suitable instructions to enable the user to cut the screen member to a length according to the measured outer width (W) of the video recorder case. The user will then push the end caps 8 on to the ends of the cut screen member, attaching the mounting members 5 using supplied double-sided adhesive tape or pads to the side walls 6 of the video casing, position the assembled cover member between the forwardly projecting pivot arms 5b and screw the pivot screws 9 into the screw threaded holes in the pivot arms 5b so that they enter the pivot holes (not shown) in the end surfaces 8A of the end pieces 8.

To release the cover from its control-covering position, the adult user presses outwardly on the cam surfaces 13 of the locking fingers 5c simultaneously in the direction of the arrow A, causing the locking fingers to spring outwardly, and pivot the cover forwardly to clear the ends of the locking fingers. The locking fingers can then be released so that they spring back to their original positions, and the cover can be pivoted upwardly to reveal the video controls 1a. To return the cover member to its control-covering position, the adult user pivots the cover downwardly until the rear edges of the end caps 8 engage the cam surfaces 13; pressure manually applied to the lower edge of the cover will then, by virtue of the engagement of the end pieces on the cam surfaces, cause the locking fingers to flex outwardly to allow the end caps to snap into the grooves 11 behind the pawl 12.

The provision of the locking fingers 5c at both ends of the cover requires for the release of the cover a degree of manual dexterity which is unusual for young children to possess, thus inhibiting their access to the video controls. The release action, however, is readily performed by an adult.

Because of the plate-like form of the mounting members 5, the cover device can be fitted to a video machine even though there may only be a relatively narrow gap between the outer face 6 of the video casing and the inner face of a side wall of, for example, a stacking cabinet in which the video is situated.

Because the cover member 3 is non-removably secured to the mounting members 5 the above-described construction avoids the inconvenience which may be experienced in use of a cover which must be completely removed from the apparatus in order to reveal the controls.

Figure 3:
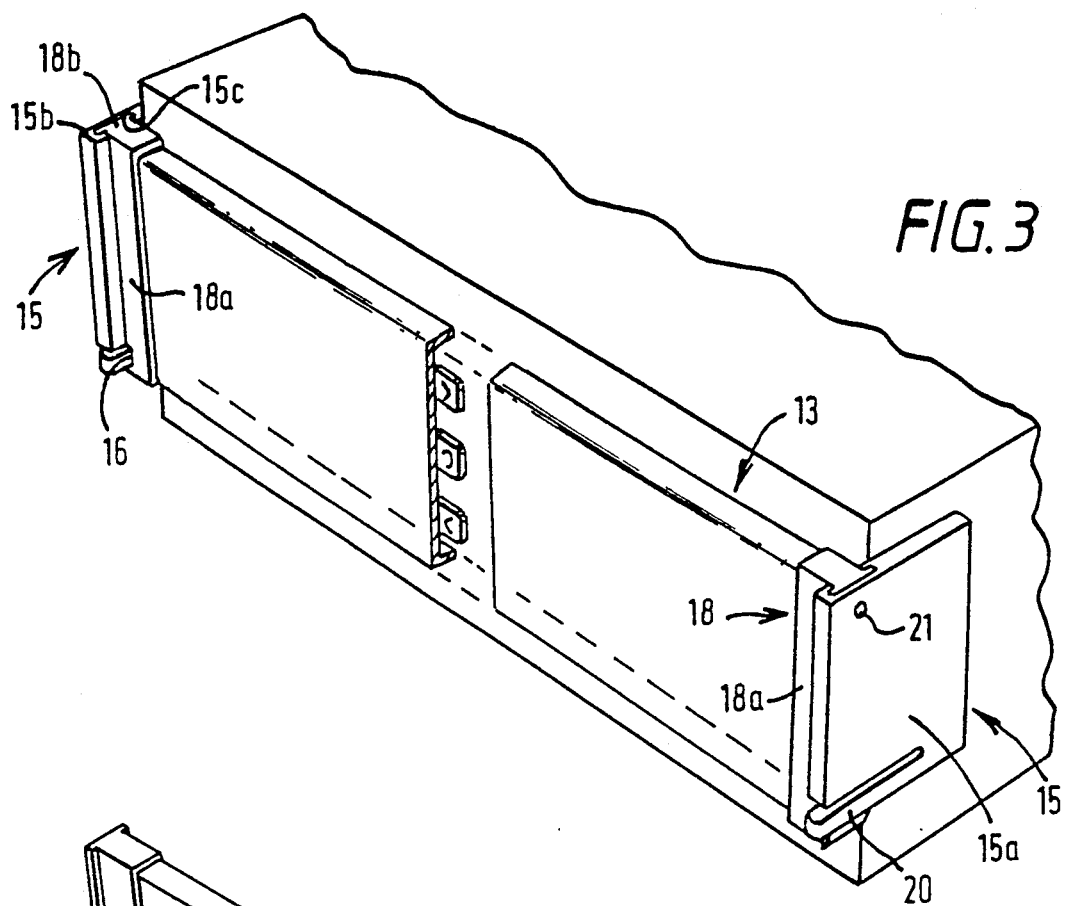
FIG. 3 is a front perspective view of a cover device according to a second embodiment of the invention, again shown assembled.
Figure 4:
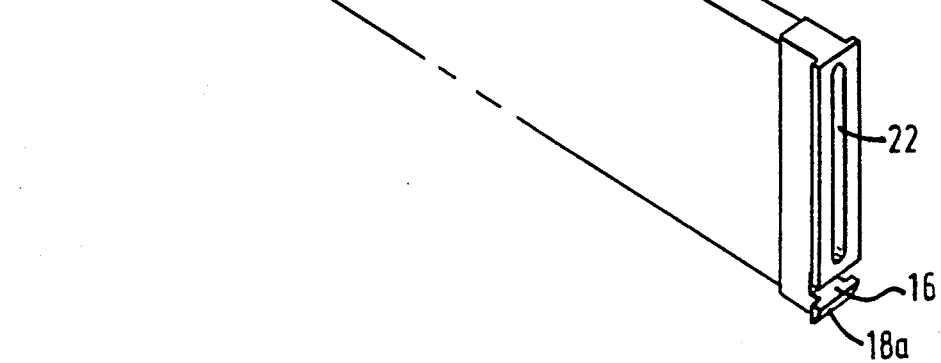
FIG. 4 is a perspective view of the cover of the device of FIG. 3 shown separate from the other components of the device.

In the second embodiment illustrated in FIGS. 3 and 4, modified forms of mounting member and cover end piece are employed to provide a sliding, rather than pivoting movement of the cover. In this embodiment, the outer profile of the cross-section of the end piece 18 of the cover 13 is substantially T-shaped, the central leg 18a of the T being hollow to receive the end of the screen member 13, the top member 18b of the T being received in a vertical, inwardly open slide channel 15c formed in a forwardly projecting portion 15b of the mounting member 15. With this arrangement, the cover can slide vertically upwardly from its control-covering position shown. The cover is normally latched in this position by spring locking fingers 20 projecting forwardly from the bottom of the main portion 15a of the mounting member, the locking fingers engaging in respective horizontal grooves 16 formed at corresponding lower positions in the end faces of the end pieces 18. The lower portions of these end faces may be chamfered as shown at 18a so as to cause the locking fingers 20 to deflect outwardly when the cover is being pressed downwardly toward its control-covering position.

In this second embodiment, the cover is non-removably retained by means of stops 21, for example screws, which project inwardly into the channels 15c of the mounting members, and are received in respective vertical slots 22 formed in the end faces of the end pieces 18. The upper limit of the movement of the cover is defined by the position of the bottom end of this slot.

Again, the cover device of the second embodiment may be supplied in kit form for attachment to an existing apparatus. The second embodiment possesses all of the advantages disclosed in relation to the first embodiment.

Although both of the above embodiments have been described as cover devices for the controls of video recorders, it will be clear that the cover device may be used on many other kinds of equipment where access to the controls on a control panel is to be inhibited.

For example, the cover may be applied to many other kinds of hi-fi units, or to the controls on kitchen appliances such as cookers, washing machines etc.

We claim:

1. A cover device for covering controls on a control panel of equipment, the device comprising an elongate cover and mounting means for displaceably attaching said cover to the equipment so that the cover extends across said control panel and is displaceable away from a covering position covering said control panel while maintaining attachment to said equipment to reveal said controls on said control panel to permit operation thereof, wherein said mounting means comprises first and second separate mounting members which are fixedly securable to said equipment at positions at or adjacent opposite ends of said control panel, said cover being movably securable at opposite ends of the cover to respective mounting members, and each of said mounting members comprising manually releasable latch means independently operable for releasably latching said cover in said covering position wherein releasing the latch means and displacing the cover from the covering position requires a pair of mutually distinct operations.

2. A cover device according to claim 1, wherein the cover is hinged to the mounting members and is pivotable to and from the covering position in which the cover lies over said control panel of the equipment.

3. A cover device according to claim 1, wherein the opposite ends of the cover are slidably received by the respective mounting members so that the cover member can slide to and from said covering position.

4. A cover device according to claim 1 wherein said manually releasable latch means comprises first and second manually releasable catches provided respectively on said first and second mounting members, for engaging the respective ends of the cover, whereby the cover member is releasably held in said covering position.

5. A cover device according to claim 1 wherein the cover comprises an elongate screen having a pair of ends which is of uniform cross-section and adapted to be cut by a user to a length suitable for a particular equipment on which the device is to be used, and a pair of end pieces which are securable to respective ends of the screen and which are adapted to be movably secured to the mounting members.

6. A cover device according to claim 1 wherein the mounting members are in a form of plate-like brackets which are adapted to be attached face-on to respective side walls of the equipment extending rearwardly from opposite ends of said control panel.

7. A cover device according to claim 1 wherein the latch means comprises first and second manually releasable latch members and wherein said required pair of mutually distinct operations comprises releasing said first latch member and releasing said second latch member.

8. A cover device for covering controls on a front panel of equipment, the equipment having opposite upright side walls extending rearwardly from opposite ends of the front panel, the device comprising an elongate cover member, and mounting means for displaceably attaching said cover member to the equipment so that said cover member extends across said front panel and is displaceable from a position covering said front panel to reveal said controls to permit operation thereof, said mounting means comprising first and second mounting members which are fixedly securable to said opposite side walls of said equipment at positions adjacent said opposite ends of said front panel, said cover member being movably securable at said opposite ends to respective mounting members, each mounting member comprising a substantially flat element having a face for attachment face-on to a respective side wall of the equipment.

9. An assembly for construction of a cover device for covering controls on a control panel of equipment, the assembly comprising:
   elements for the construction of an elongate cover including, an elongated screen of uniform cross-section, and a pair of end pieces attachable to opposite ends of the screen;
   first and second mounting members fixedly securable to said equipment at positions at or adjacent opposite ends of said control panel for displaceably mounting said cover to the equipment so that said cover extends across said front panel; and
   means for manually releasably locating said pair of end pieces relative to respective first and second mounting members in a position covering said control panel.

10. A cover device for covering controls on a control panel of equipment, the device comprising an elongate cover and mounting means for displaceably attaching said cover to the equipment so that said cover extends across said control panel and is displaceable away from a position covering the controls on the control panels while maintaining attachment to said equipment to reveal said controls to permit operation thereof, wherein said mounting means comprises first and second separate mounting members which are fixedly securable to said equipment at positions at or adjacent opposite ends of said control panel, said cover being movably securable at opposite ends of the cover to respective mounting members, and said mounting members comprising manually releasable latch means for releasably latching said cover in said covering position wherein releasing the latch means and displacing the cover member from the control-covering position requires a pair of mutually distinct operations.

* * * * *